United States Patent
Tseng et al.

(10) Patent No.: US 12,406,877 B2
(45) Date of Patent: Sep. 2, 2025

(54) HOMOGENEOUS SOURCE/DRAIN CONTACT STRUCTURE

(71) Applicant: Taiwan Semiconductor Manufacturing Company, Ltd., Hsinchu (TW)

(72) Inventors: Ya-Ching Tseng, Hsinchu (TW); Chang-Wen Chen, Hsinchu (TW); Po-Hsiang Huang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 588 days.

(21) Appl. No.: 17/388,171

(22) Filed: Jul. 29, 2021

(65) Prior Publication Data
US 2022/0336269 A1    Oct. 20, 2022

Related U.S. Application Data

(60) Provisional application No. 63/175,342, filed on Apr. 15, 2021.

(51) Int. Cl.
*H01L 21/768* (2006.01)
*H01L 23/522* (2006.01)

(52) U.S. Cl.
CPC .... *H01L 21/76808* (2013.01); *H01L 23/5226* (2013.01); *H01L 21/76805* (2013.01)

(58) Field of Classification Search
CPC ......... H01L 21/76808; H01L 21/76813; H01L 21/76805
See application file for complete search history.

(56) References Cited

U.S. PATENT DOCUMENTS

| | | |
|---|---|---|
| 9,520,362 B2 | 12/2016 | Lin et al. |
| 9,613,856 B1 | 4/2017 | Yang et al. |
| 9,716,032 B2 | 7/2017 | Tang et al. |
| 9,972,529 B2 | 5/2018 | Yang et al. |
| 10,163,691 B2 | 12/2018 | Shih et al. |
| 10,170,322 B1 | 1/2019 | Cheng et al. |

(Continued)

FOREIGN PATENT DOCUMENTS

| | | |
|---|---|---|
| KR | 20160136715 | 11/2016 |
| KR | 20180112278 | 10/2018 |

*Primary Examiner* — Yu Chen
(74) *Attorney, Agent, or Firm* — HAYNES AND BOONE, LLP

(57) ABSTRACT

A method according to the present disclosure includes receiving a workpiece that includes a first source/drain feature, a first dielectric layer over the first source/drain feature, and a source/drain contact disposed in the first dielectric layer and over the first source/drain feature. The method further includes depositing a second dielectric layer over the source/drain contact and the first dielectric layer, forming a source/drain contact via opening through the second dielectric layer to expose the source/drain contact, depositing a sacrificial plug in the source/drain contact via opening, depositing a third dielectric layer over the second dielectric layer and the sacrificial plug, forming a trench in the third dielectric layer to expose the sacrificial plug, removing the sacrificial plug to expose the source/drain contact via opening, and after the removing of the sacrificial plug, forming an integrated conductive feature into the trench and the exposed source/drain contact via opening.

20 Claims, 13 Drawing Sheets

(56) References Cited

U.S. PATENT DOCUMENTS

| | | | |
|---|---|---|---|
| 10,312,188 B1* | 6/2019 | Srivastava | H01L 23/528 |
| 2005/0275110 A1* | 12/2005 | Maekawa | H01L 21/76814 |
| | | | 257/E21.585 |
| 2011/0100697 A1* | 5/2011 | Yang | H01L 21/76831 |
| | | | 174/262 |
| 2011/0210447 A1* | 9/2011 | Seidel | H01L 21/76814 |
| | | | 438/653 |
| 2015/0364420 A1* | 12/2015 | Lin | H01L 23/485 |
| | | | 438/668 |
| 2016/0276158 A1* | 9/2016 | Hsiao | H01L 29/42376 |
| 2016/0343708 A1 | 11/2016 | Park et al. | |
| 2017/0194247 A1* | 7/2017 | Chang | H01L 21/76832 |
| 2018/0096934 A1* | 4/2018 | Siew | H01L 29/41791 |
| 2018/0286957 A1 | 10/2018 | Bae et al. | |
| 2021/0020565 A1* | 1/2021 | Cheng | H01L 21/76877 |

* cited by examiner

HOMOGENEOUS SOURCE/DRAIN CONTACT STRUCTURE

PRIORITY DATA

This application claims priority to U.S. Provisional Patent Application No. 63/175,342, filed on Apr. 15, 2021, entitled "Homogeneous Source/Drain Contact Structure," the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

For example, as integrated circuit (IC) technologies progress towards smaller technology nodes, back-end-of-line (BEOL) interconnect features, such as source/drain contact vias and metal lines, become smaller as well. The smaller interconnect features may lead to increased resistance and increased resistive-capacitive delay (RC delay). Reduction of RC delay has become more and more important and challenging. Therefore, while existing interconnect features are generally satisfactory for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
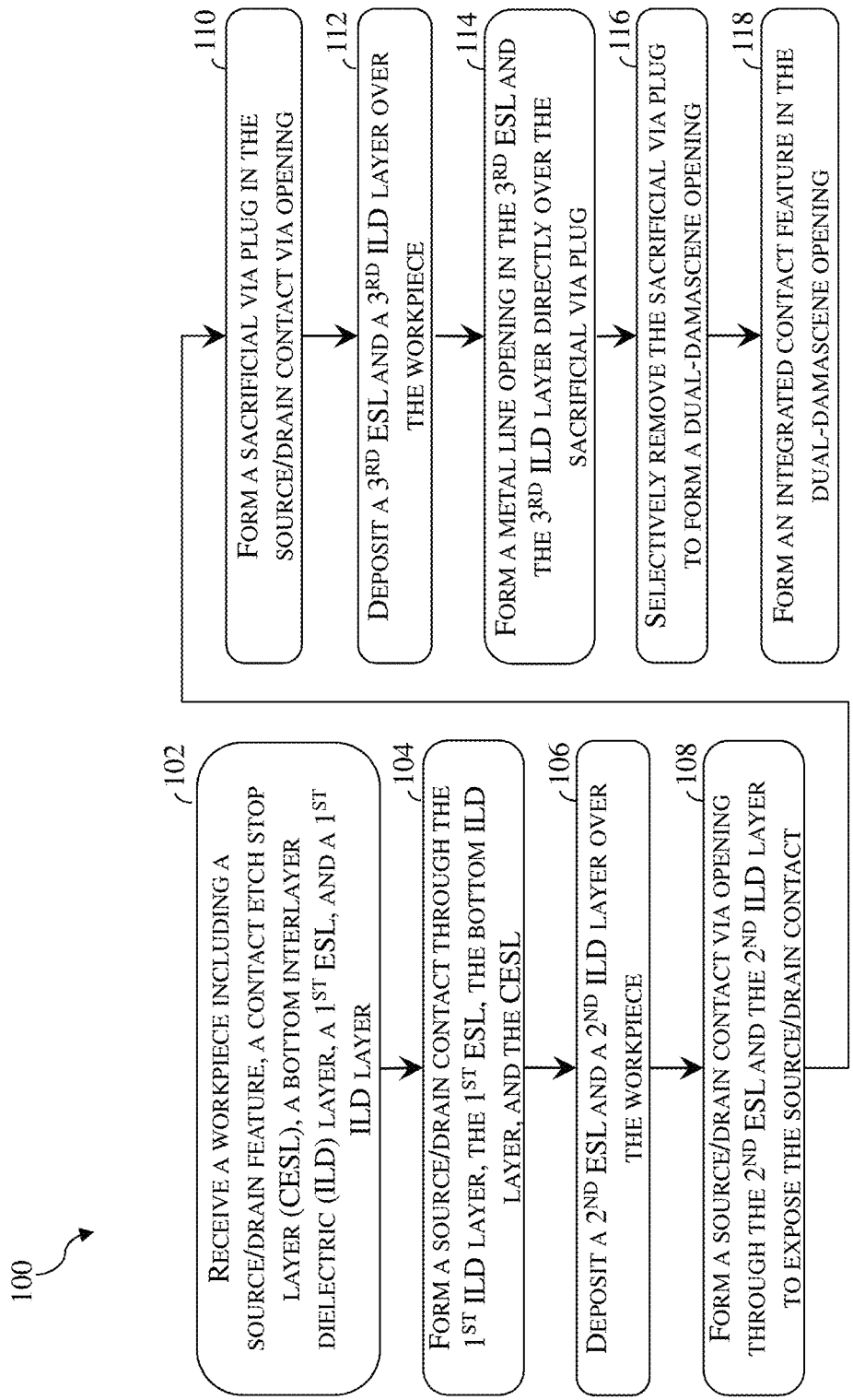
FIG. 1 is a flow chart of a method for fabricating an integrated contact feature that includes a source/drain contact via and a metal line, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming active regions (such as fins or fin-like epitaxial layer stacks), gate structures, and source and drain features (generally referred to as source/drain features). MEOL generally encompasses processes related to fabricating contacts to FEOL features, such as contacts to the gate structures and/or the source/drain features. BEOL generally encompasses processes related to fabricating a multilayer interconnect (MLI) feature that interconnects IC features fabricated by FEOL and MEOL (referred to herein as FEOL and MEOL features or structures, respectively), thereby enabling operation of the IC devices.

In some existing schemes, source/drain contact vias and metal lines that are coupled to the source/drain contact vias are formed separately using different metal fill materials. In these existing schemes, a source/drain contact via is formed over and in direct contact with a source/drain contact. A metal line trench is then formed in a dielectric layer over the source/drain contact via. Metal fill materials are then deposited in the metal line trench to form a metal line. The metal line and the source/drain contact via may have different metal fill materials. A barrier layer may come between the metal line and the source/drain contact via and forms a heterogeneous interface, leading to increased contact resistance between the metal line and the source/drain contact via.

The present disclosure provides a method to form an integrated contact feature that includes both a source/drain contact via and a metal line connected thereto. In some embodiments, a sacrificial plug is first formed in a source/drain contact via opening as a placeholder while a metal line trench is formed directly over the source/drain contact via opening. After the formation of the metal line trench, the sacrificial plug is removed to expose the dual-damascene opening that includes the source/drain contact via opening and the metal line trench. A barrier layer and a metal fill layer are deposited into the dual-damascene opening to form the integrated contact feature. The integrated contact feature includes a source/drain contact via as a lower portion and a metal line as an upper portion. The source/drain contact via and the metal line are continuous and homogeneous. Because the source/drain contact via and the metal line in the integrated contact feature do not include a heterogeneous interface, it has lower resistance, thereby reducing the RC delay.

The various aspects of the present disclosure will now be described in more detail with reference to the figures. In that regard, FIG. 1 is a flowchart illustrating a method 100 of forming an integrated contact feature that includes a source/drain contact via and a metal line connected thereto, according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIGS. 2-13, which are fragmentary cross-sectional views or top views of a workpiece 200 at different stages of fabrication according to embodiments of the method 100 in FIG. 1. For avoidance of doubts, the X, Y and Z directions in FIGS. 2-13 are perpendicular to one another and are used consistently throughout FIGS. 2-13. Because the workpiece 200 will be fabricated into a semiconductor device or a semiconductor structure, the workpiece 200 may be referred to herein as a semiconductor device 200 or a semiconductor structure 200 as the context requires. Throughout the present disclosure, like reference numerals denote like features unless otherwise expressly excepted.

Figure 2:
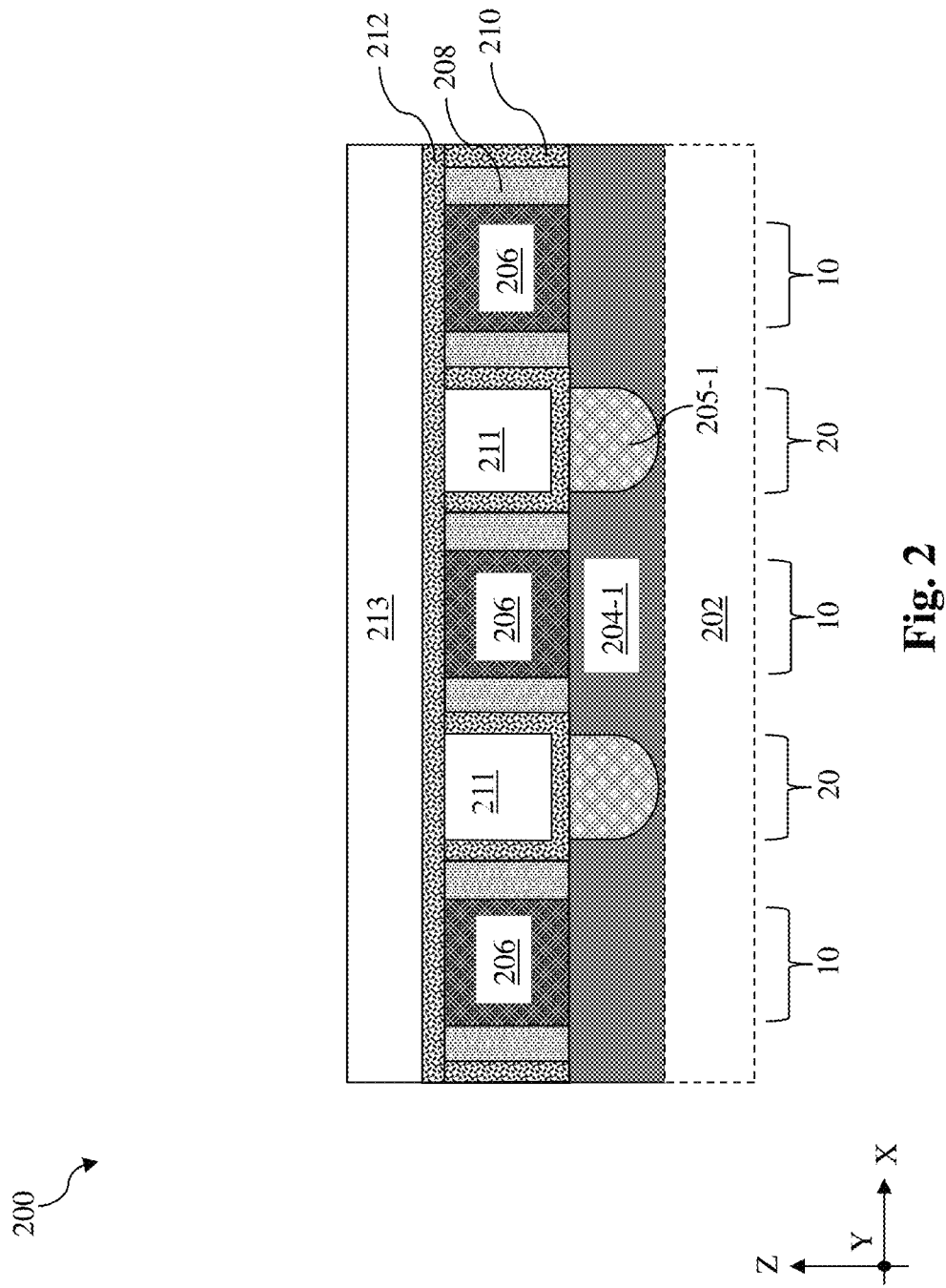
FIGS. 2-13 are fragmentary cross-sectional or top views of a workpiece at various stages of fabrication of the method in FIG. 1, according to various aspects of the present disclosure.

Referring to FIGS. 1 and 2, the method 100 includes a block 102 where a workpiece 200 is received. The workpiece 200 includes a substrate 202. In the depicted embodiment, substrate 202 includes silicon (Si). Alternatively or additionally, substrate 202 may include another elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide (InSb); an alloy semiconductor, such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); or combinations thereof. In some implementations, substrate 202 includes one or more group III-V materials, one or more group II-IV materials, or combinations thereof. In some implementations, substrate 202 is a semiconductor-on-insulator substrate, such as a silicon-on-insulator (SOI) substrate, a silicon germanium-on-insulator (SGOI) substrate, or a germanium-on-insulator (GeOI) substrate. Semiconductor-on-insulator substrates can be fabricated using separation by implantation of oxygen (SIMOX), wafer bonding, and/or other suitable methods. Substrate 202 can include various doped regions (not shown) configured according to design requirements of semiconductor device 200, such as p-type doped regions, n-type doped regions, or combinations thereof. P-type doped regions (for example, p-type wells) include p-type dopants, such as boron (B) or $BF_2$, other p-type dopant, or combinations thereof. N-type doped regions (for example, n-type wells) include n-type dopants, such as phosphorus (P), arsenic (As), other n-type dopant, or combinations thereof. An ion implantation process, a diffusion process, and/or other suitable doping process can be performed to form the various doped regions.

Figure 12:
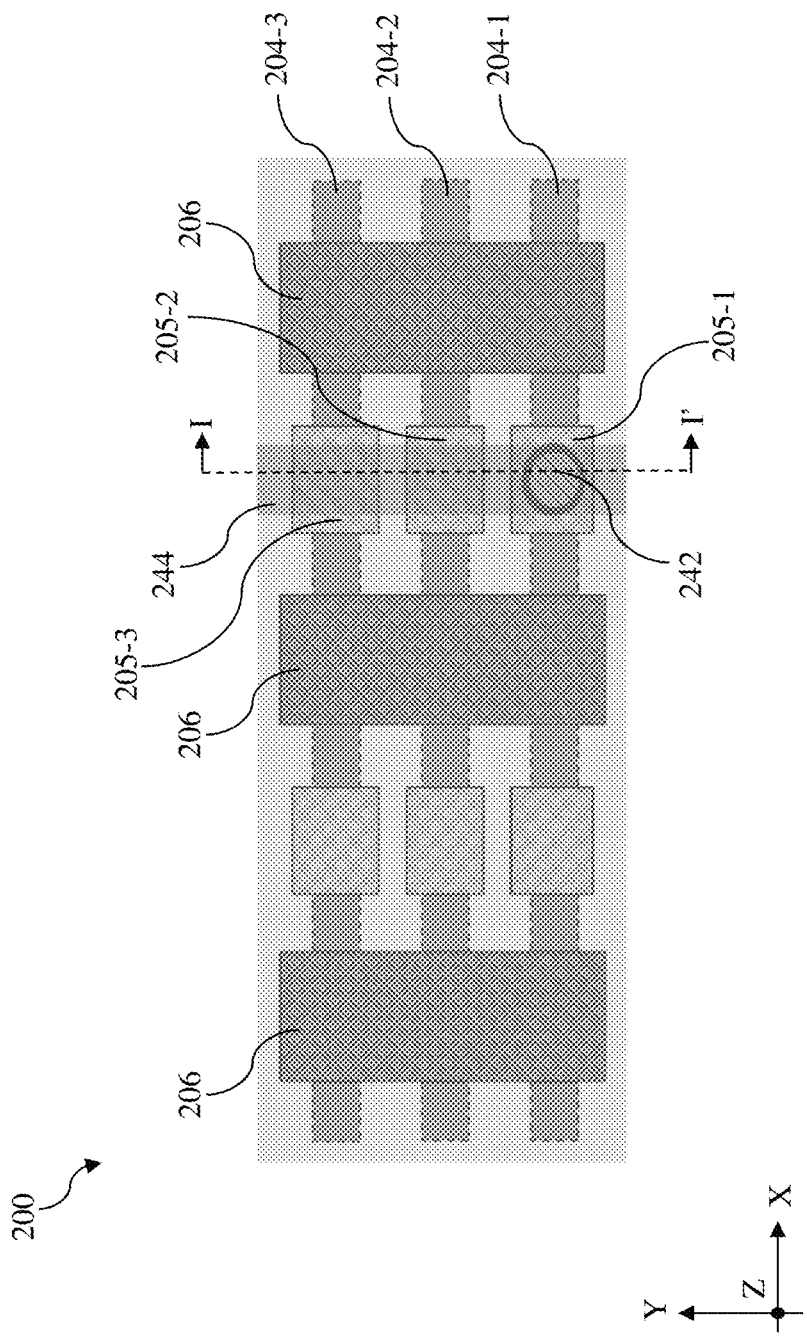
Figure 13:
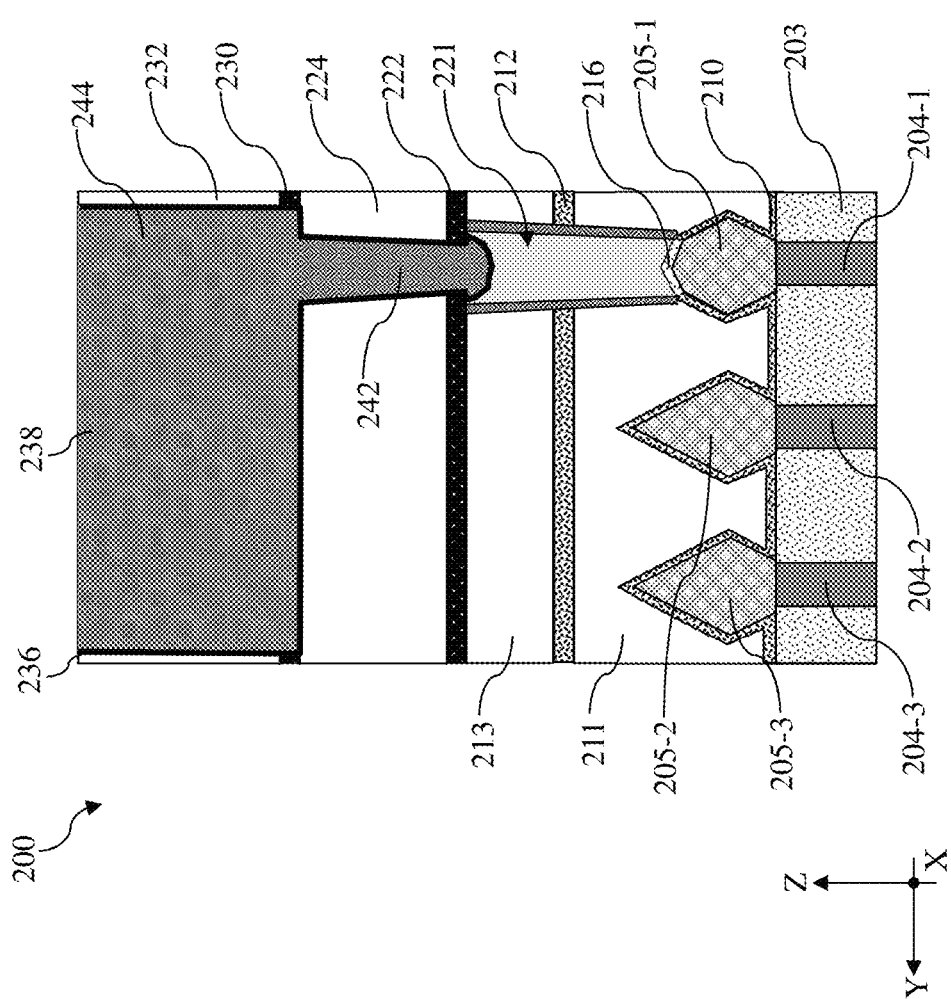

The workpiece 200 includes a plurality of fins (or fin elements). Out of the plurality of fins, a first fin 204-1 is shown in FIG. 2, and a second fin 204-2 and a third fin 204-3 are shown in FIGS. 12 and 13. In some embodiments, the plurality of fins may be formed from patterning a portion of the substrate 202. In some alternative embodiments, the plurality of fins may be formed from patterning one or more epitaxial layers deposited over the substrate 202. In the depicted embodiment, the first fin 204-1 is formed from patterning a portion of the substrate 202 and includes silicon (Si). Although not explicitly shown in FIG. 2, an isolation feature 203 (shown in FIGS. 12 and 13) may be formed between the plurality of the fins to separate adjacent fins. In some embodiments, the isolation feature 203 may include silicon oxide, silicon nitride, silicon oxynitride, fluorine-doped silicate glass (FSG), a low-k dielectric, combinations thereof, and/or other suitable materials.

As shown in FIG. 2, the workpiece 200 further includes gate structures 206 that are disposed over channel regions 10 of the first fin 204-1. The channel regions 10 of the first fin 204-1 are interleaved by source/drain regions 20. In some implementations, gate structures 206 wrap over channel regions 10 of the first fin 204-1. Each of the channel regions 10 interpose two source/drain regions 20. While not explicitly shown in the figures, each of the gate structures 206 includes a gate dielectric layer and a gate electrode over the gate dielectric. The gate dielectric layer may include an interfacial layer and a high-k dielectric layer. In some instances, the interfacial layer may include silicon oxide. The high-k dielectric layer is formed of dielectric materials having a high dielectric constant, for example, greater than a dielectric constant of silicon oxide (k≈3.9). Exemplary high-k dielectric materials for the high-k dielectric layer include hafnium oxide (HfO), titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. In one embodiment, the high-k dielectric layer is formed of hafnium oxide (HfO). The gate electrode may include multiple layers, such as work function layers, glue/barrier layers, and/or metal fill (or bulk) layers. A work function layer may be formed of n-type work function materials or p-type work function materials. P-type work function materials include TiN, TaN, Ru, Mo, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as aluminum (Al), copper (Cu), tungsten (W), ruthenium (Ru), titanium (Ti), a suitable metal, or a combination thereof.

Sidewalls of the gate structures 206 are lined with at least one gate spacer 208. In some embodiments, the at least one gate spacer 208 may include silicon carbonitride, silicon oxycarbide, silicon oxycarbonitride, or silicon nitride. In some embodiments, a gate replacement or a gate last process may be used to form the gate structures 206. In an example gate last process, dummy gate stacks are formed over channel regions 10 of the first fin 204-1. The at least one gate spacer 208 is then deposited over the workpiece 200, including over sidewalls of the dummy gate stacks. An anisotropic etch process is then performed to recess the source/drain regions 20 to form source/drain trenches, leaving behind the at least one gate spacer 208 extending along sidewalls of the dummy gate stacks. After formation of the source/drain trenches, source/drain features (such as the first source/drain feature 205-1 shown in FIG. 2) are deposited into the source/drain trenches in the source/drain regions 20. The source/drain features may be formed by vapor-phase epitaxy (VPE), ultra-high vacuum CVD (UHV-CVD), LPCVD, and/or PECVD), molecular beam epitaxy (MBE), or other suitable epitaxy processes, or combinations thereof. The source/drain features may also be referred to as epitaxial features. Depending on the design of the semiconductor device 200, source/drain features may be n-type or p-type. When the source/drain features are n-type, they may include silicon (Si) doped with an n-type dopant, such as phosphorus (P) or arsenic (As). When the source/drain features are p-type, they may include silicon germanium (SiGe) doped with a p-type dopant, such as boron (B) or $BF_2$. In some implementations, annealing processes may be performed to activate dopants in source/drain features of the semiconductor device 200. In the depicted embodiments, the first source/drain feature 205-1 may include phosphorus-doped silicon (Si: P) or boron-doped silicon germanium (SiGe: B).

A contact etch stop layer (CESL) 210 and a bottom interlayer dielectric (ILD) layer 211 are disposed over the source/drain features (such as the first source/drain feature 205-1) and along sidewalls of the at least one gate spacer 208. In some embodiments, the CESL 210 includes a silicon nitride layer, a silicon oxynitride layer, and/or other materials known in the art. The CESL 210 may be deposited using atomic layer deposition (ALD), plasma-enhanced ALD (PEALD), plasma-enhanced chemical vapor deposition (PECVD), and/or other suitable deposition processes. The bottom ILD layer 211 includes dielectric materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The bottom ILD layer 211 may be deposited by CVD, spin-on coating, or other suitable deposition technique. In a gate-last process, after the CESL 210 and the bottom ILD layer 211 are deposited, the workpiece 200 is planarized using a chemical mechanical polishing (CMP) process to expose the dummy gate stacks. The dummy gate stacks are then removed and replaced with the gate structures 206, the composition of which is described above.

The workpiece 200 also includes a first etch stop layer (ESL) 212 and a first interlayer dielectric (ILD) layer 213. Because the first ESL 212 is disposed over top surfaces of the gate structures 206, the first ESL 212 may also be referred to as a gate-top etch stop layer 212. The composition and formation of the first ESL 212 may be similar to those of the CESL 210 and the composition and formation of the first ILD layer 213 may be similar to those of the bottom ILD layer 211. Detailed description of the first ESL 212 and the first ILD layer 213 are therefore omitted for brevity.

Figure 3:
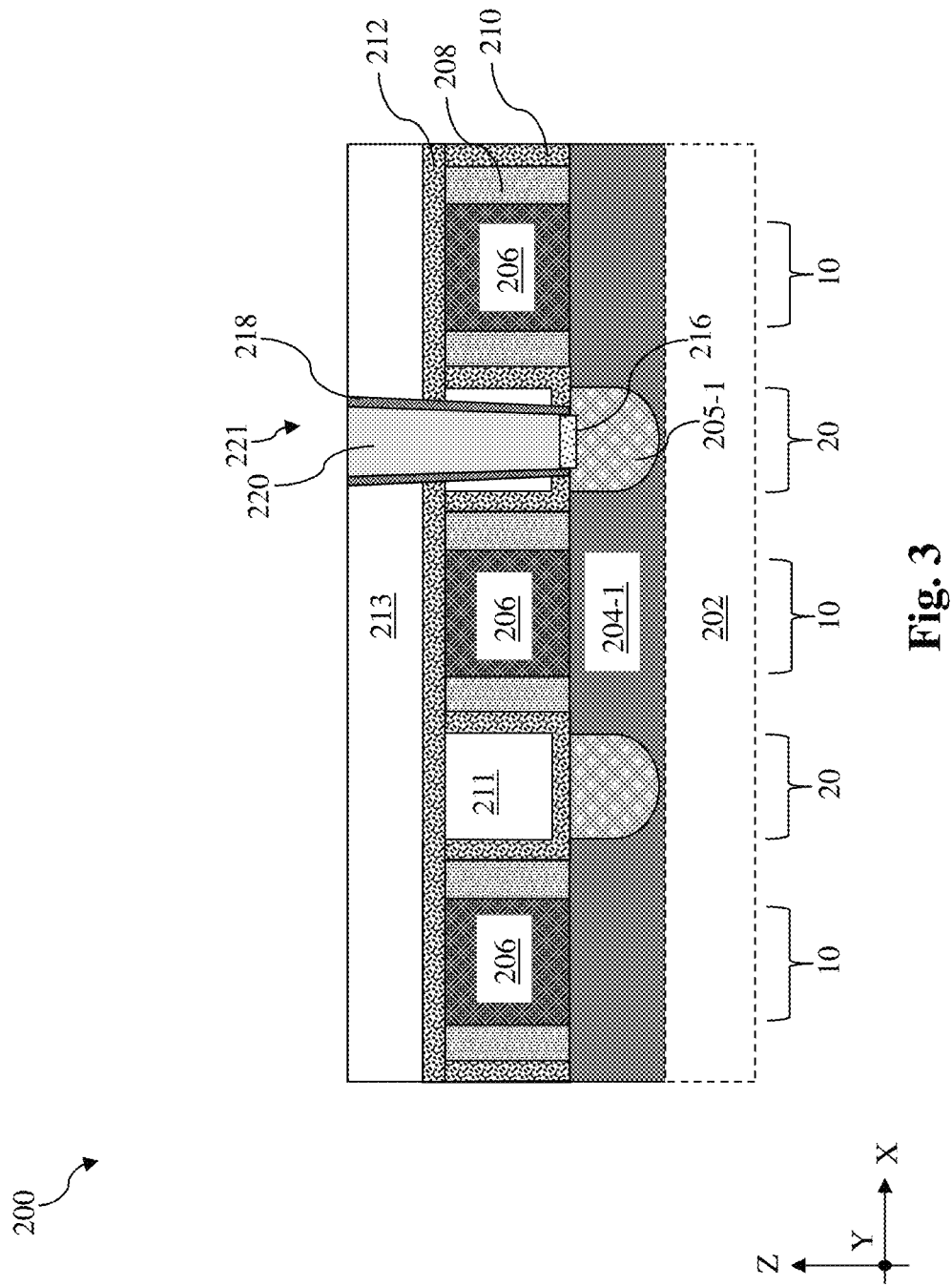

Referring now to FIGS. 1 and 3, the method 100 includes a block 104 where a source/drain contact 221 is formed. The source/drain contact 221 is disposed over the first source/drain feature 205-1, as shown in FIG. 3. Block 104 includes formation of a source/drain contact opening through the first ILD layer 213, the first ESL 212, the bottom ILD layer 211, and the CESL 210 as well as formation of the source/drain contact 221 in the source/drain contact opening. The formation of the source/drain contact opening may include use of lithography processes and/or etching processes. In some implementations, the lithography processes include forming a resist layer over the first ILD layer 213, exposing the resist layer to pattern radiation, and developing the exposed resist layer, thereby forming a patterned resist layer that can be used as a masking element for etching the source/drain contact opening to expose at least a portion of the first source/drain feature 205-1. The etching processes may include a dry etch process that includes use of a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a hydrocarbon species (e.g. $CH_4$), a bromine-containing gas (e.g., HBr and/or $CHBr_3$), an iodine-containing gas, other suitable gases and/or plasmas, and/or combinations thereof. After the formation of the source/drain contact opening, a silicide feature 216 and a barrier layer 218 are formed in the source/drain contact opening. In some instances, the silicide feature 216 may include titanium silicide, cobalt silicide, nickel silicide, tantalum silicide, or tungsten silicide. The barrier layer 218 may include a metal or a metal nitride, such as a titanium nitride, cobalt nitride, nickel, tungsten nitride. Thereafter, a metal fill layer 220 is deposited over the barrier layer 218 to form the source/drain contact 221. The metal fill layer 220 may include tungsten (W), ruthenium (Ru), cobalt (Co), nickel (Ni), or copper (Co). In the depicted embodiment, the metal fill layer 220 includes cobalt (Co). After the deposition of the metal fill layer 220, a CMP process may be performed to remove excess materials and define the final shape of the source/drain contact 221.

Figure 4:
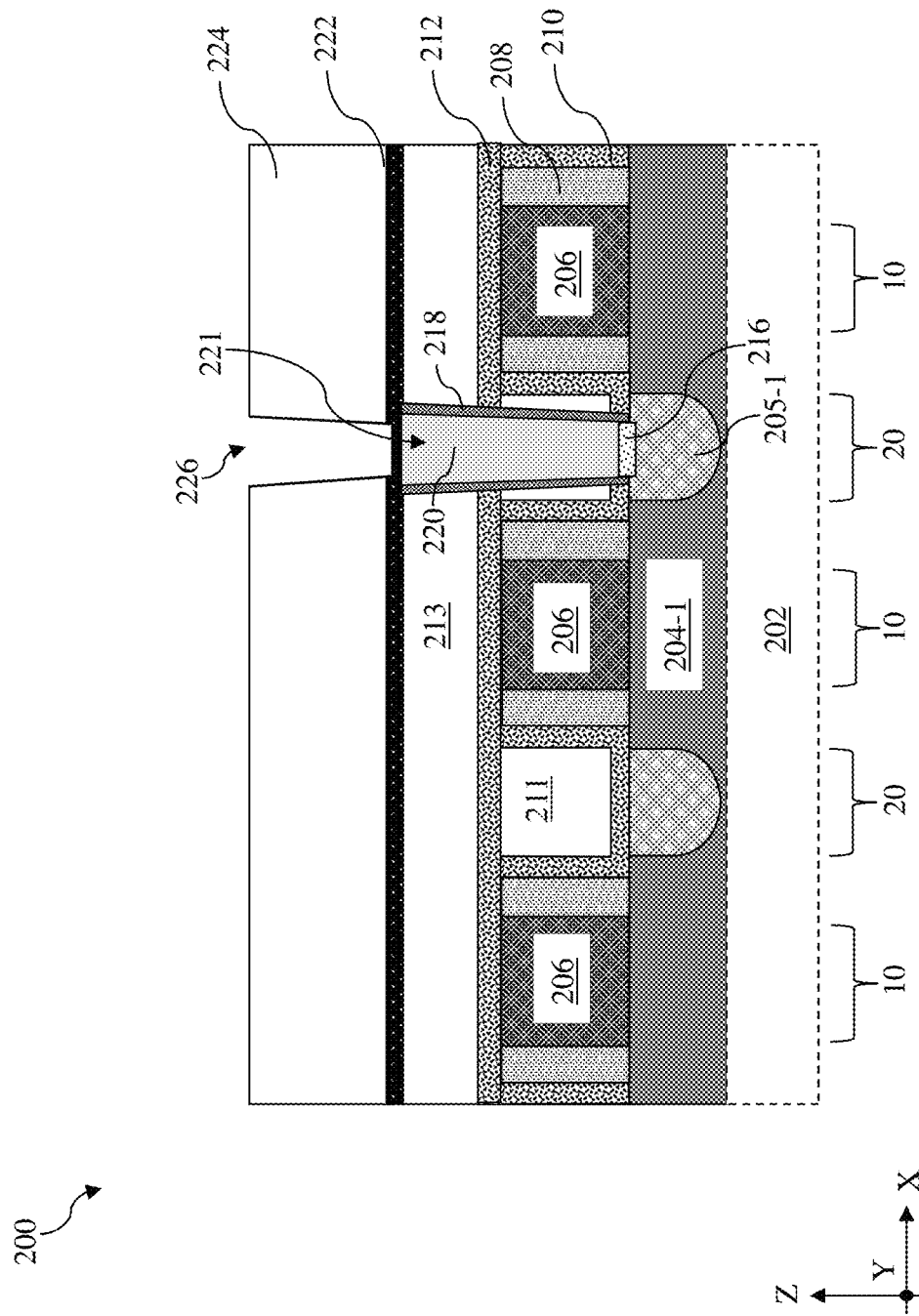

Referring now to FIGS. 1 and 4, the method 100 includes a block 106 where a second etch stop layer (ESL) 222 and a second interlayer dielectric (ILD) layer 224 are deposited over the workpiece 200. In some embodiments, the composition and formation of the second ESL 222 may be similar to those of the CESL 210 and the composition and formation of the second ILD layer 224 may be similar to those of the bottom ILD layer 211. Detailed description of the second ESL 222 and the second ILD layer 224 are therefore omitted for brevity.

Figure 5:
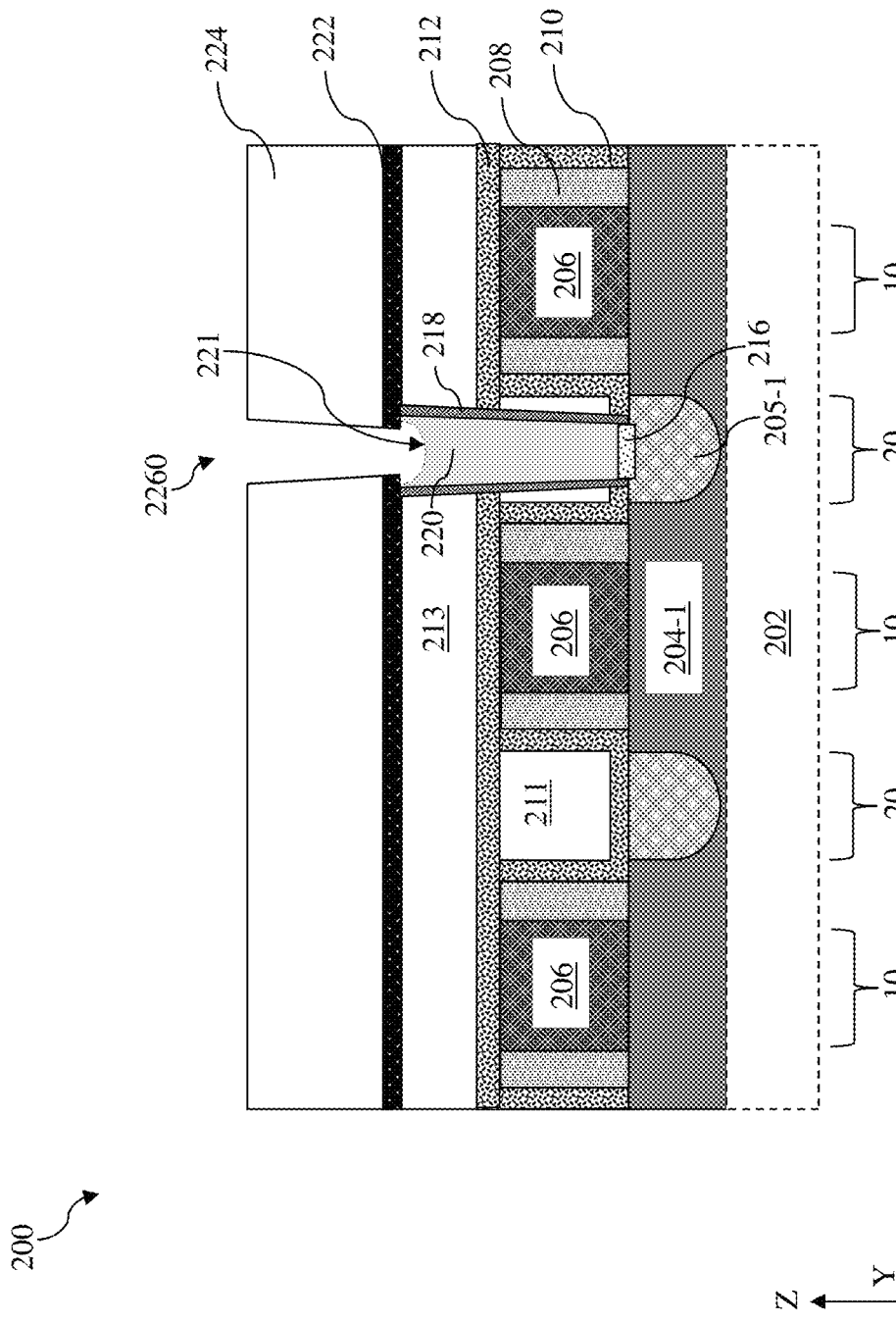

Referring to FIGS. 1, 4, and 5, the method 100 includes a block 108 where a source/drain contact via opening 2260 is formed through the second ESL 222 and the second ILD layer 224 to expose the source/drain contact 221. Operations at block 108 may include formation of a pilot opening 226 (shown in FIG. 4) and extending the pilot opening 226 to form the source/drain contact via opening 2260 (shown in FIG. 5). The formation of the pilot opening 226 may include photolithography processes and etch processes. The photolithography processes form an etch mask that includes an opening over the source/drain contact 221. Referring to FIG. 4, a dry etch process is then performed to etch completely through the second ILD layer 224 and at least a portion of the second ESL 222. In some embodiments, after the dry etch process, the source/drain contact 221 may remain covered by a portion of the second ESL 222. In some other embodiments, the source/drain contact 221 is exposed in the pilot opening 226. An example dry etch process for block 108 may include use of nitrogen ($N_2$), hydrogen ($H_2$), a hydrocarbon species (e.g. $CH_4$), a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In one embodiment, the pilot opening 226 is etched using a nitrogen plasma, a hydrogen plasma, or both. Reference is now made to FIG. 5. A selective wet etch process may be performed to selectively recess the source/drain contact 221 to extend the pilot opening 226, thereby forming the source/drain contact via opening 2260. As shown in FIG. 5, when a selective wet etch process is used, the source/drain contact 221 is recessed. In some implementations, the selective wet etch process includes use of deionized (DI) water, 2-anilino-4-methyl-1,3-thiazole-5-carboxylic acid, nitric acid, hydrogen peroxide, hydrochloride, or isopropyl alcohol (IPA).

Figure 6:
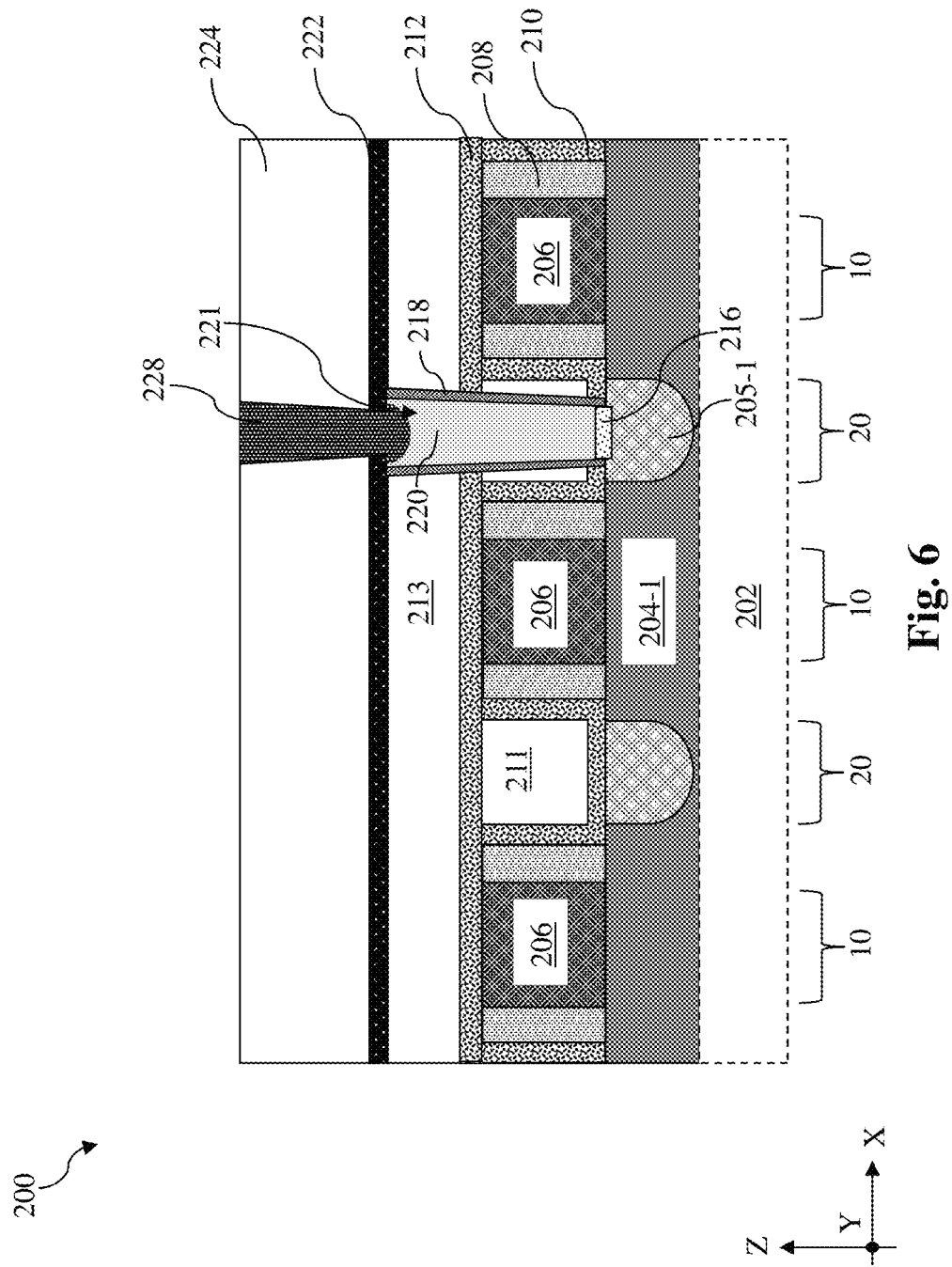

Referring to FIGS. 1 and 6, method 100 includes a block 110 where a sacrificial via plug 228 is formed in the source/drain contact via opening 2260. The sacrificial via plug 228 serves as a placeholder for the formation of the metal line trench 234 (to be described below) and will be selective removed. For that reason, a composition of the sacrificial via plug 228 is selected such that it may be selectively removed without damaging the second ESL 222 or the second ILD layer 224. In other words, a composition of the sacrificial via plug 228 is different from a composition of the second ESL 222 or the second ILD layer 224. In some embodiments, the sacrificial via plug 228 may include polymers, metals, or semiconductor materials. Example polymers may include polyimide. Example metals may include tungsten (W), which may be selectively etched relative to the metal fill layer 220 in the source/drain contact 221. In some alternative embodiments, the sacrificial via plug 228 may include silicon (Si), germanium (Ge), or silicon germanium (SiGe). In an example process, materials for the sacrificial via plug 228 is deposited over the source/drain contact via opening 2260 using ALD, CVD, epitaxial growth, a suitable deposition method, or a combination thereof. Then a planarization process, such as a CMP process, is performed to remove excess material from the top surface of the second ILD layer 224. At the conclusion of the operations at block 110, the sacrificial via plug 228 is formed. In one embodiment, the sacrificial via plug 228 is formed of silicon germanium (SiGe).

Figure 7:
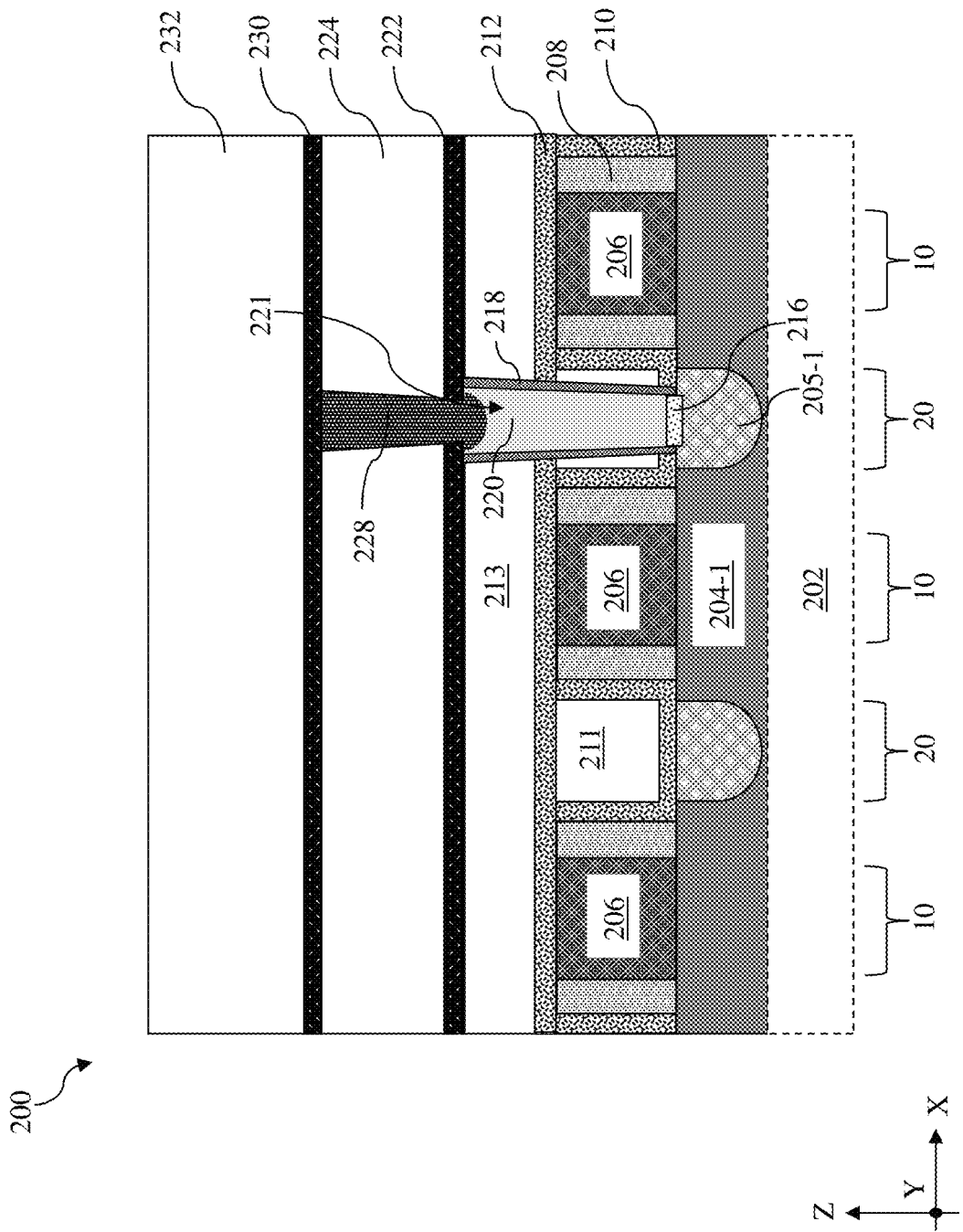

Referring to FIGS. 1 and 7, method 100 includes a block 112 where a third etch stop layer (ESL) 230 and a third ILD layer 232 are formed over the sacrificial via plug 228. In some embodiments, the composition and formation of the third ESL 230 may be similar to those of the CESL 210 and the composition and formation of the third ILD layer 232 may be similar to those of the bottom ILD layer 211. Detailed description of the third ESL 230 and the third ILD layer 232 are therefore omitted for brevity. It is noted that, as shown in FIG. 7, the third ESL 230 is disposed on top surfaces of the sacrificial via plug 228 and the second ILD layer 224. The third ILD layer 232 is disposed directly on the third ESL 230.

Figure 8:
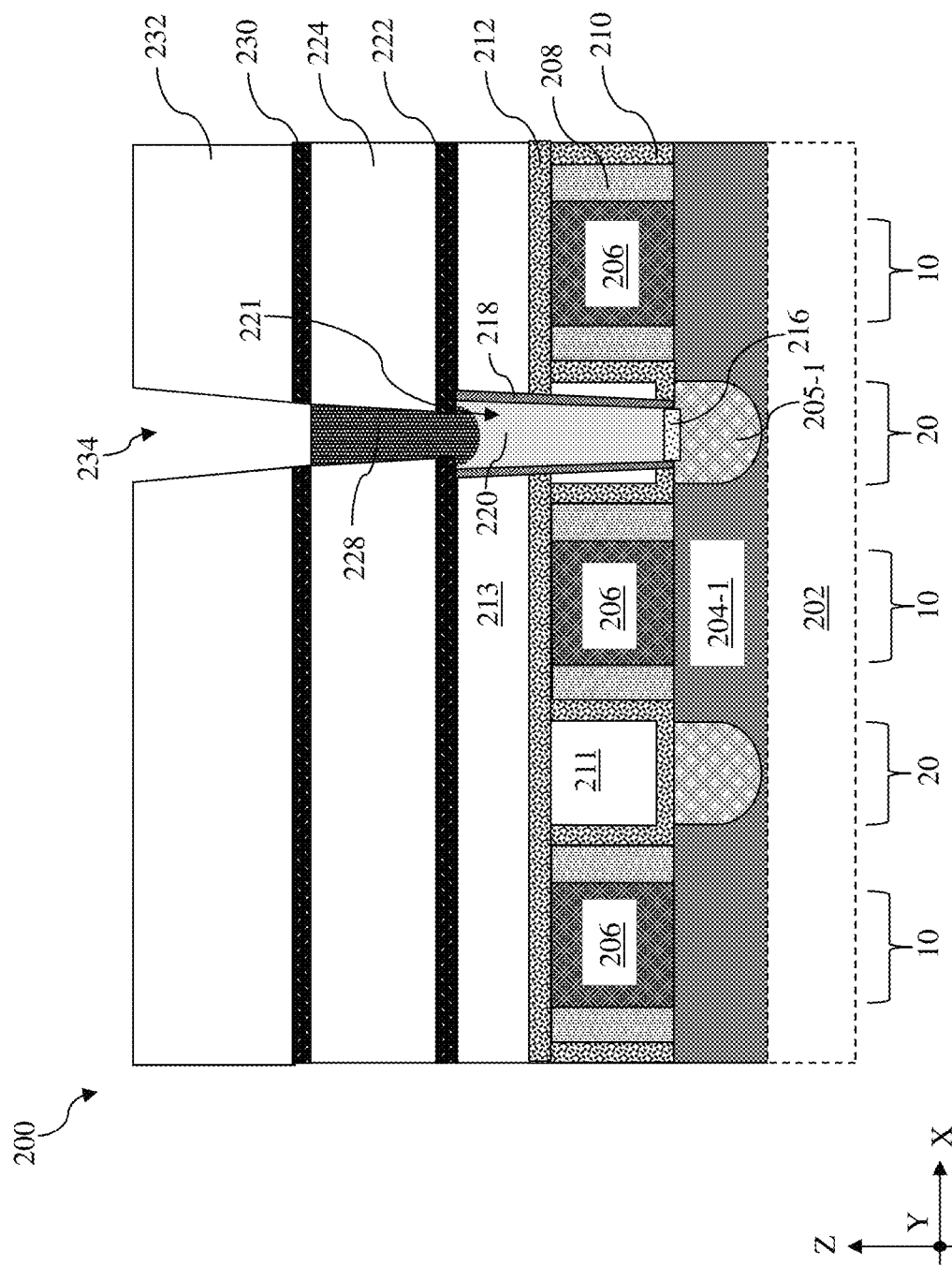

Referring to FIGS. 1 and 8, method 100 includes a block 114 where a metal line trench 234 is formed in the third ESL 230 and the third ILD layer 232. The formation of the metal line trench 234 includes photolithography processes and etch processes. In an example process, a patterned multi-layer mask layer (not explicitly shown) is formed over the workpiece 200. The patterned multi-layer mask layer includes an opening directly over the sacrificial via plug 228. The multi-layer mask layer may be a tri-layer having a bottom layer (i.e., a hard mask layer), a middle layer (i.e. a bottom antireflective coating (BARC)) over the bottom layer and a photoresist layer over the middle layer. Using the patterned multi-layer mask layer as an etch mask, the third ESL 230 and the third ILD layer 232 over the sacrificial via plug 228 are etched using a dry etch process until a top surface of the sacrificial via plug 228 is exposed in the metal line trench 234. It is noted that the bottom surface of the metal line trench 234 may be equal to or even smaller than the top surface of the sacrificial via plug 228. In instances where the alignment is not perfect, the metal line trench 234 may be slightly offset from the top surface of the sacrificial via plug 228 along the X direction. An example dry etch process for block 114 may include use of a fluorine-containing gas (e.g., $CF_4$, $SF_6$, $CH_2F_2$, $CHF_3$, and/or $C_2F_6$), a hydrocarbon species (e.g., $CH_4$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. After the dry etch process, the patterned multi-layer mask layer may be removed by ashing. Unlike the source/drain contact via opening 2260 that is directly over the source/drain contact 221, the metal line trench 234 may extend further along the Y direction and span over more than one active region. To be precise, the metal line trench 234 may span over more than one source/drain features, rather than just over the first source/drain feature 205-1.

Figure 9:
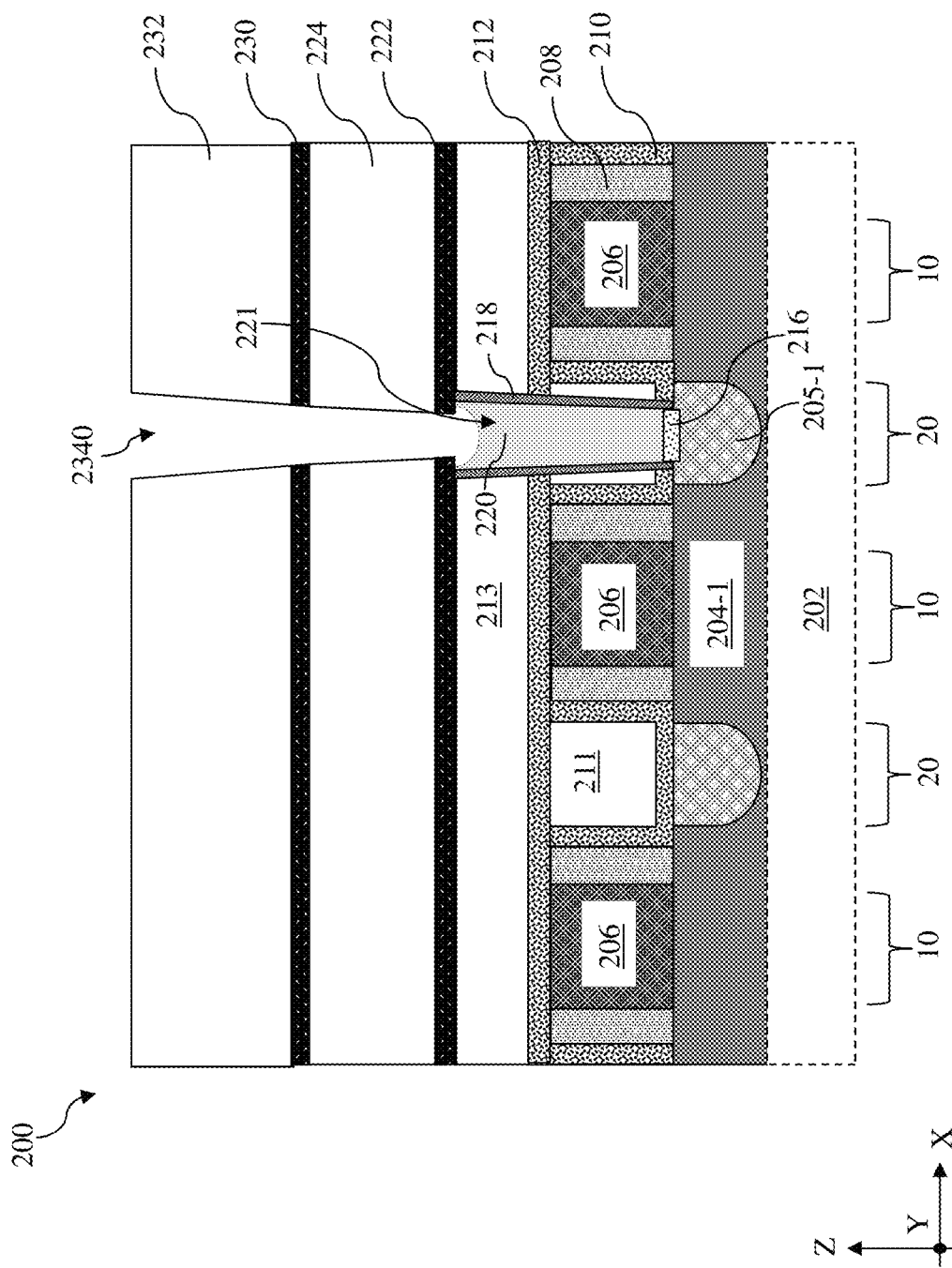

Referring to FIGS. 1 and 9, method 100 includes a block 116 where the sacrificial via plug 228 is removed to form a dual-damascene opening 2340. Depending on its composition, the sacrificial via plug 228 may be selectively removed using a dry etch process or wet etch process. For example, when the sacrificial via plug 228 is formed of polymers, such as polyimide, the sacrificial via plug 228 may be removed by ashing or dry etching using plasma of nitrogen or argon. When the sacrificial via plug 228 is formed of tungsten and the source/drain contact 221 includes cobalt, the sacrificial via plug 228 may be removed using an acidic etchant or an alkaline etchant. An example acidic etchant may include nitric acid, hydrofluoric acid, hydrogen peroxide, or a combination thereof. An example alkaline etchant may include a solution of potassium hydroxide, potassium ferricyanide, or both. When the sacrificial via plug 228 is formed of silicon germanium (SiGe), it may be removed using a wet etchant such as hydrogen peroxide, acetic acid, hydrofluoric acid, or a combination thereof. After the removal of the sacrificial via plug 228, the source/drain contact via opening 2260 is exposed again. The exposed source/drain contact via opening 2260 is in fluid communication with the metal line trench 234. The exposed source/drain contact via opening 2260 and the metal line trench 234 collectively form the dual-damascene opening 2340.

Figure 10:
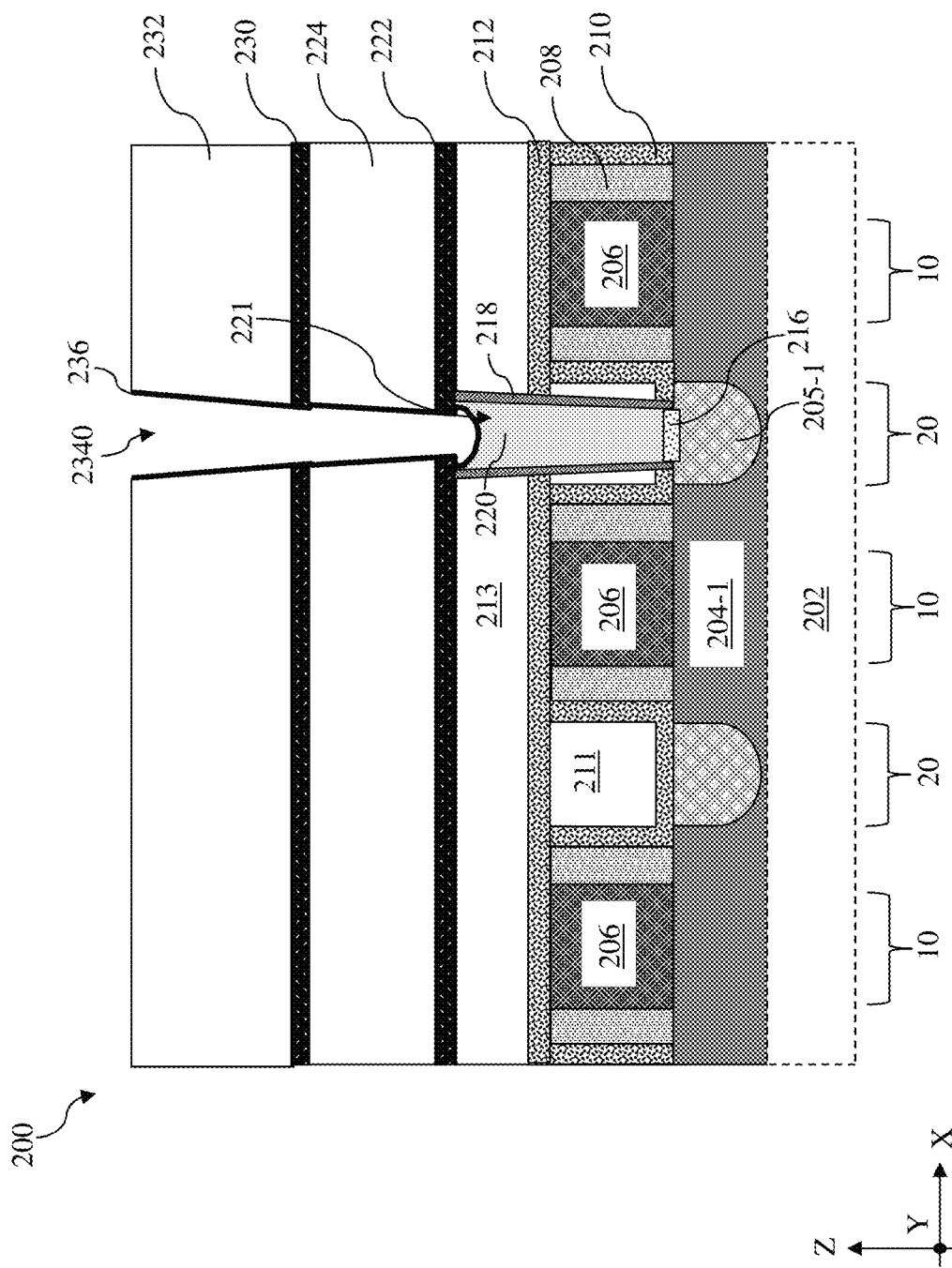
Figure 11:
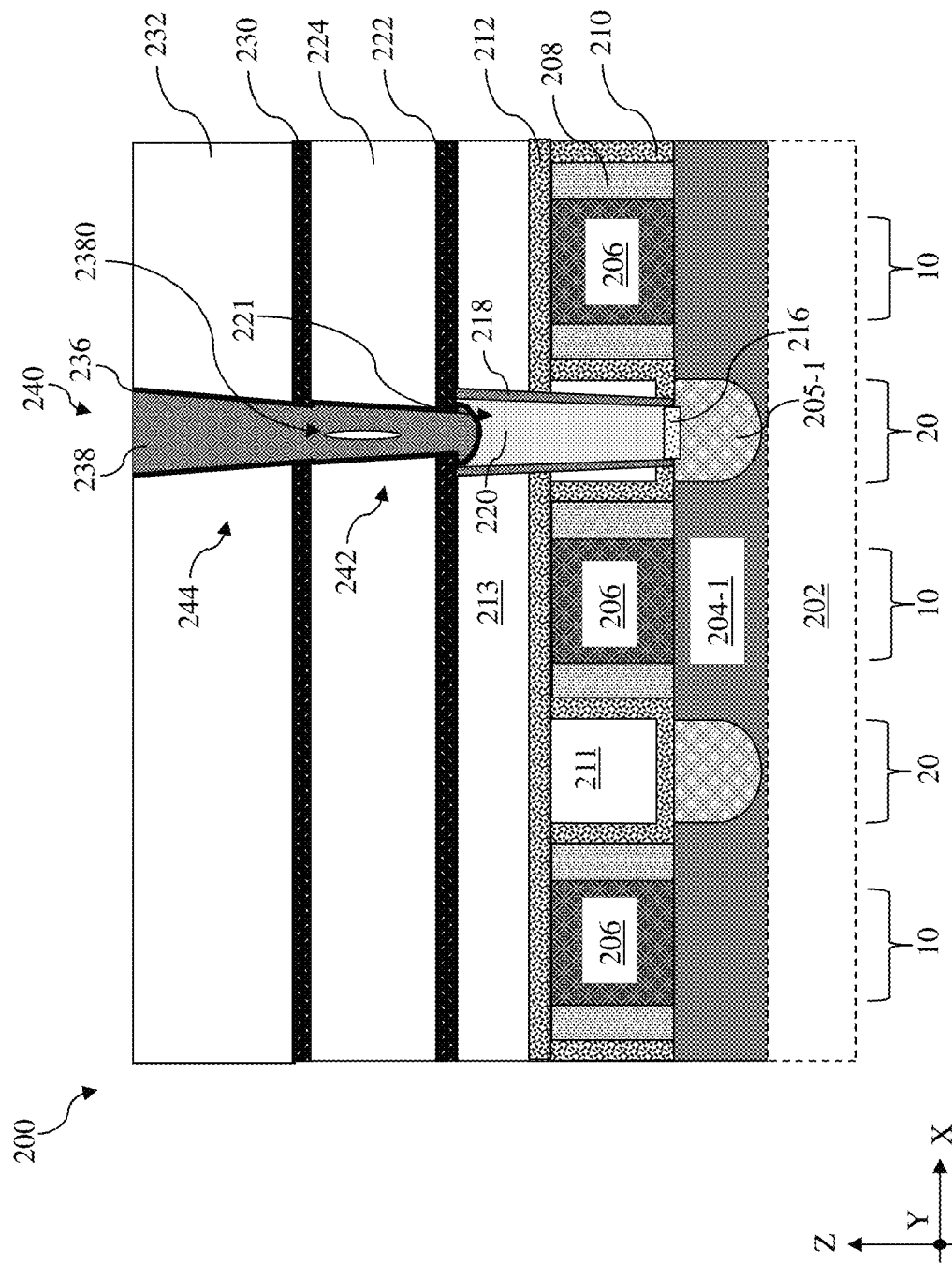

Referring to FIGS. 1 and 10-13, method 100 includes a block 118 where an integrated contact feature 240 is formed in the dual-damascene opening 2340. Operations at block 118 include deposition of a barrier layer 236 (shown in FIG. 10), deposition of a metal fill layer 238 (shown in FIG. 11), and a planarization process to remove excess materials (shown in FIG. 11). Referring first to FIG. 10, the barrier layer 236 is deposited using ALD, CVD, or physical vapor deposition (PVD). In some implementations, the barrier layer 236 includes a metal nitride, such as titanium nitride (TiN) or tantalum nitride (TaN). In the depicted embodiment, the barrier layer 236 is formed of tantalum nitride (TaN). Referring then to FIG. 11, after the formation of the barrier layer 236, the metal fill layer 238 is deposited over the workpiece 200, including over the barrier layer 236 and the third ILD layer 232. In some embodiments, the deposition of the metal fill layer 238 may be performed to fill the dual-damascene opening 2340 in one step using electroplating, electroless plating, or a bottom-up deposition method. In a bottom-up deposition method, a nucleation layer is first formed and a bulk metal layer is gradually deposited on the nucleation layer in a bottom-up, layer-by-layer manner. The metal fill layer 238 may include a conductive metal, such as copper (Cu) or ruthenium (Ru). When the metal fill layer 238 is formed of copper (Cu), the metal fill layer 238 may be deposited by electroplating or electroless plating. To improve wetting and adhesion, the copper metal fill layer 238 may be subject to an anneal or a reflow process. When the metal fill layer 238 is formed of ruthenium, the metal fill layer 238 is deposited using bottom-up deposition. In some alternative embodiments, the metal fill layer 238 may include tungsten (W) deposited using bottom-up deposition. In these alternative embodiments, because tungsten (W) is less prone to electro-migration, the barrier layer 236 may be omitted to reduce contact resistance. In some instances, the one-step deposition of the metal fill layer 238 may be less than ideal and may leave behind a void 2380.

Referring still to FIG. 11, after the deposition of the metal fill layer 238, a CMP process is performed to the workpiece 200 to remove excess materials. At this point, the integrated contact feature 240 is formed as shown in FIG. 11. After the CMP process at block 118, top surfaces of the integrated contact feature 240 and the third ILD layer 232 are substantially coplanar. As shown in FIG. 11, the integrated contact feature 240 includes a lower portion 242 embedded in the second ILD layer 224 and the second ESL 222 and an upper portion 244 embedded in the third ILD layer 232 and the third ESL 230. The lower portion 242 is disposed in the source/drain contact via opening 2260 (shown in FIG. 5) and may be referred to as a source/drain contact via 242. The upper portion 244 is disposed in the metal line trench 234 (shown in FIG. 8) and may be referred to as a metal line 244. The void 2380, when formed, is likely in the lower portion 242 or the source/drain contact via 242.

A fragmentary top view and a fragmentary cross-section view of the workpiece 200 are shown in FIG. 12 and FIG. 13, respectively to illustrate further details of the integrated contact feature 240. Referring to FIG. 12, the workpiece 200 includes, besides the first fin 204-1, a second fin 204-2 and a third fin 204-3. The first, second and third fins 204-1, 204-2 and 204-3 extend parallel to one another along the X direction. The workpiece 200 also includes, besides the first source/drain feature 205-1 disposed over a source/drain region of the first fin 204-1, a second source/drain feature 205-2 disposed over the second fin 204-2 and a third source/drain feature 205-3 disposed over the third fin 204-3. As illustrated in FIG. 12, a vertical projection area of the source/drain contact via 242 falls completely within the area of the first source/drain feature 205-1 and the source/drain contact via 242 does not extend over the second source/drain feature 205-2 and the third source/drain feature 205-3. The metal line 244, on the other hand, span over multiple source/drain features, such as the first source/drain feature 205-1, the second source/drain feature 205-2, and the third source/drain feature 205-3. Although not explicitly shown, the workpiece 200 may include more source/drain features and the metal line 244 may extend over more than three source/drain features. It is noted that, for illustration purposes, some layers or features of the workpiece 200 are omitted from the top layout view in of the workpiece 200 in FIG. 12.

Reference is now made to FIG. 13, which illustrates a cross-sectional view of the workpiece 200 viewed along section I-I' in FIG. 12. As shown in FIG. 13, the source/drain contact via 242 of the integrated contact feature 240 is disposed directly over and in direct contact with the source/drain contact 221 while the metal line 244 of the integrated contact feature 240 extends along the Y direction over the first source/drain feature 205-1, the second source/drain feature 205-2 and the third source/drain feature 205-3. The metal line 244 is disposed in the third ESL 230 and the third ILD layer 232. The source/drain contact via 242 is disposed in the second ILD layer 224 and the second ESL 222. As shown in FIG. 13, the source/drain contact via 242 also extends into the source/drain contact 221 and undercuts the second ESL 222. The source/drain contact via 242 and the metal line 244 of the integrated contact feature 240 have homogenous composition and do not include a heterogeneous interface. The barrier layer 236 extends along the interface between the integrated contact feature 240 and adjacent features. The barrier layer 236 spaces the metal fill layer 238 away from the source/drain contact 221, the second ESL 222, the second ILD layer 224, the third ESL 230, and the third ILD layer 232. Unlike some existing structures, the barrier layer 236 does not extend between the source/drain contact via 242 and the metal line 244. In one embodiment the barrier layer 236 is formed of tantalum nitride and the metal fill layer 238 is formed of copper (Cu) or ruthenium (Ru).

The integrated contact feature and methods of forming the same described in the present disclosure provide several benefits. In an example method, a sacrificial plug is first formed in a source/drain contact via opening as a placeholder while a metal line trench is formed directly over the source/drain contact via opening. After the formation of the metal line trench, the sacrificial plug is removed to expose the dual-damascene opening that includes the source/drain contact via opening and the metal line trench. A barrier layer and a metal fill layer are deposited into the dual-damascene opening to form the integrated contact feature. The integrated contact feature includes a source/drain contact via as a lower portion and a metal line as an upper portion. The source/drain contact via and the metal line are continuous and homogeneous. Because the source/drain contact via and the metal line in the integrated contact feature are formed of highly conductive metal such as copper (Cu) or ruthenium (Ru) and do not include a heterogeneous interface, the integrated contact feature lowers resistance, thereby reducing the RC delay.

The present disclosure provides for many different embodiments. In one embodiment, a method is provided. The method includes receiving a workpiece that includes a first source/drain feature, a first dielectric layer over the first source/drain feature, and a source/drain contact disposed in the first dielectric layer and over the first source/drain feature, depositing a second dielectric layer over the source/drain contact and the first dielectric layer, forming a source/drain contact via opening through the second dielectric layer to expose the source/drain contact, depositing a sacrificial plug in the source/drain contact via opening, depositing a third dielectric layer over the second dielectric layer and the sacrificial plug, forming a trench in the third dielectric layer to expose the sacrificial plug, removing the sacrificial plug to expose the source/drain contact via opening, and after the removing of the sacrificial plug, forming an integrated conductive feature into the trench and the exposed source/drain contact via opening.

In some embodiments, the sacrificial plug includes polymer, metal, or silicon oxide. In some instances, the removing of the sacrificial plug includes a dry etch process or a wet etch process. In some embodiments, the forming of the integrated conductive feature includes depositing copper (Cu) or ruthenium (Ru) using a bottom-up deposition method. In some implementations, the forming of the integrated conductive feature further includes before the depositing of copper or ruthenium, depositing a barrier layer into the trench and the exposed source/drain contact via opening. In some instances, the barrier layer includes tantalum nitride (TaN). In some embodiments, the workpiece further includes a second source/drain feature and the trench spans over both the first source/drain feature and the second source/drain feature. In some implementations, a composition of the integrated conductive feature is homogeneous from the source/drain contact to the third dielectric layer.

In another embodiment, a method is provided. The method includes receiving a workpiece that includes a source/drain feature, a first dielectric layer over the first source/drain feature, and a source/drain contact disposed in the first dielectric layer and over the source/drain feature, depositing a first etch stop layer (ESL) and a second dielectric layer over the source/drain contact and the first dielectric layer, forming a source/drain contact via opening through the first ESL and the second dielectric layer to expose the source/drain contact, depositing a sacrificial plug in the source/drain contact via opening, depositing a second ESL and a third dielectric layer over the second dielectric layer and the sacrificial plug, forming a trench in the second ESL and the third dielectric layer to expose the sacrificial plug, selectively removing the sacrificial plug to expose the source/drain contact via opening, and after the removing of the sacrificial plug, forming a source/drain contact via in the source/drain contact via opening and a metal line in the trench.

In some embodiments, a portion the source/drain contact via opening undercuts the first ESL. In some implementations, a portion the source/drain contact via opening extends into the source/drain contact. In some instances, a composition of the sacrificial plug is different from a composition of the source/drain contact, the first ESL, and the second dielectric layer. In some embodiments, the sacrificial plug includes polymer. In some implementations, the source/drain contact via and the metal line include a continued interface. In some instances, the forming of the source/drain contact via and the metal line includes depositing a barrier layer over the source/drain contact via opening and the trench, and depositing a metal fill layer over the barrier layer. In some embodiments, the barrier layer includes tantalum nitride (TaN) and the metal fill layer include copper (Cu) or ruthenium (Ru).

In still another embodiment, a semiconductor structure is provided. The semiconductor structure includes a first active region, a first source/drain feature disposed over the first active region, a source/drain contact disposed over and in contact with the first source/drain feature, a source/drain contact via disposed over and in contact with the source/drain contact, a second active region extending parallel to the first active region, a second source/drain feature disposed over the second active region, and a metal line disposed over the first source/drain feature and the second source/drain feature. A composition of the metal line is identical to a composition of the source/drain contact via.

In some embodiments, the metal line and the source/drain contact via include a barrier layer and a metal fill layer, the barrier layer extends continuously from the metal line to the source/drain contact via, and the metal fill layer extends continuously from the metal line to the source/drain contact via. In some implementations, the barrier layer includes tantalum nitride (TaN) and the metal fill layer includes copper (Cu) or ruthenium (Ru). In some instances, the barrier layer does not extend between the metal line and the source/drain contact via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    receiving a workpiece comprising:
        a first gate structure and a second gate structure,
        a first gate spacer disposed along a sidewall of the first gate structure,
        a second gate spacer disposed along a sidewall of the second gate structure,
        a first source/drain feature and a second source/drain feature disposed between the first gate structure and the second gate structure along a first direction,
        a contact etch stop layer (CESL) over the first source/drain feature,
        a first dielectric layer over the CESL and disposed between the first gate spacer and the second gate spacer such that the first dielectric layer is spaced apart from the first gate spacer and the second gate spacer by the CESL,
        a first etch stop layer (ESL) over and in contact with the CESL and the first dielectric layer,
        a middle dielectric layer over the first ESL, and
        a source/drain contact extending through the middle dielectric layer, the first ESL, the first dielectric layer, and the CESL to interface the first source/drain feature; depositing a second ESL over the source/drain contact and the first dielectric layer; depositing a second dielectric layer over the second ESL;
    forming a source/drain contact via opening by etching through the second dielectric layer and the second ESL to expose the source/drain contact, wherein the etching forms an undercut below the second ESL;
    depositing a sacrificial plug in the source/drain contact via opening such that a portion of the sacrificial plug fills in the undercut;

depositing a third dielectric layer over the second dielectric layer and the sacrificial plug;
forming a trench in the third dielectric layer to expose the sacrificial plug;
removing the sacrificial plug to expose the source/drain contact via opening; and
after the removing of the sacrificial plug, forming an integrated conductive feature into the trench and the exposed source/drain contact via opening,
wherein the first source/drain feature and the second source/drain feature are aligned along a second direction perpendicular to the first direction,
wherein the trench spans over a top surface of the second source/drain feature.

2. The method of claim 1, wherein the sacrificial plug comprises polymer, metal, or silicon oxide.

3. The method of claim 1, wherein the removing of the sacrificial plug comprises a dry etch process or a wet etch process.

4. The method of claim 1, wherein the forming of the integrated conductive feature comprises depositing copper (Cu) or ruthenium (Ru) using a bottom-up deposition method.

5. The method of claim 4, wherein the forming of the integrated conductive feature further comprises:
before the depositing of copper or ruthenium, depositing a barrier layer into the trench and the exposed source/drain contact via opening.

6. The method of claim 5, wherein the barrier layer comprises tantalum nitride (TaN).

7. The method of claim 1,
wherein the first source/drain feature is disposed over a first fin,
wherein the second source/drain feature is disposed over a second fin adjacent the first fin,
wherein the first fin and the second fin extends lengthwise in parallel along the first direction,
wherein an isolation feature is disposed between the first fin and the second fin along a second direction perpendicular to the first direction,
wherein the CESL continuously extends from over the first source/drain feature to over the isolation feature,
wherein the CESL interfaces a top surface of the isolation feature.

8. The method of claim 1, wherein a composition of the integrated conductive feature is homogeneous from the source/drain contact to the third dielectric layer.

9. A method, comprising:
receiving a workpiece comprising:
a first source/drain feature disposed over a first fin,
a second source/drain feature disposed over a second fin extending lengthwise in parallel with the first fin along a first direction,
a contact etch stop layer (CESL) over the first source/drain feature,
a first dielectric layer over the CESL,
a first etch stop layer (ESL) over the CESL and the first dielectric layer,
a middle dielectric layer over the first ESL, and
a source/drain contact extending through the middle dielectric layer, the first ESL, the first dielectric layer, and CESL to interface the first source/drain feature;
depositing a second etch stop layer (ESL) and a second dielectric layer over the source/drain contact and the first dielectric layer;
forming a source/drain contact via opening by etching through the second ESL and the second dielectric layer to expose the source/drain contact, wherein the etching forms an undercut below the second ESL;
depositing a sacrificial plug in the source/drain contact via opening such that a portion of the sacrificial plug fills in the undercut;
depositing a third ESL and a third dielectric layer over the second dielectric layer and the sacrificial plug;
forming a trench in the third ESL and the third dielectric layer to expose the sacrificial plug, wherein the trench spans over a top surface of the second source/drain feature;
selectively removing the sacrificial plug to expose the source/drain contact via opening; and
after the removing of the sacrificial plug, forming a source/drain contact via in the source/drain contact via opening and a metal line in the trench.

10. The method of claim 9, wherein a portion of the second ESL overhangs the portion of the source/drain contact via opening.

11. The method of claim 9, wherein a portion the source/drain contact via opening extends into the source/drain contact.

12. The method of claim 9, where a composition of the sacrificial plug is different from a composition of the source/drain contact, the second ESL, and the second dielectric layer.

13. The method of claim 9, wherein the sacrificial plug comprises polymer.

14. The method of claim 9, wherein the source/drain contact via and the metal line comprise a continued interface.

15. The method of claim 9, wherein the forming of the source/drain contact via and the metal line comprises:
depositing a barrier layer over the source/drain contact via opening and the trench; and
depositing a metal fill layer over the barrier layer, wherein the metal fill layer is spaced apart from the second ESL, the second dielectric layer, the third ESL, and the third dielectric layer by the barrier layer.

16. The method of claim 15, wherein the barrier layer comprises tantalum nitride (TaN) and the metal fill layer comprises copper (Cu) or ruthenium (Ru).

17. The method of claim 15, wherein the barrier layer is a first barrier layer, and the workpiece further comprises a second barrier layer extending along a sidewall surface of the source/drain contact, wherein, a portion of the first barrier layer is laterally separated from the second barrier layer by a portion of the source/drain contact.

18. A method, comprising:
receiving a workpiece comprising:
a contact etch stop layer (CESL), a lower dielectric layer over the CESL,
a first etch stop layer (ESL) over and in contact with the CESL and the lower dielectric layer,
a first dielectric layer over the first ESL, and
a contact feature extending through the first ESL, the first dielectric layer, the lower dielectric layer, and the CESL;
depositing a second etch stop layer (ESL) and a second dielectric layer over the contact feature and the first dielectric layer;
forming a via opening through the second ESL and the second dielectric layer to expose a top surface of the contact feature, wherein a portion of the via opening extends laterally to form an undercut directly below a bottom surface of the second ESL;

depositing a polymeric material in the via opening such that a portion of the polymeric material fills in the undercut;

depositing a third ESL and a third dielectric layer over the second dielectric layer and the polymer material;

forming a trench in the third ESL and the third dielectric layer to expose the polymeric material;

selectively removing the polymeric material to expose the top surface of the contact feature; and after the selectively removing of the polymeric material, depositing a metal fill layer in the via opening and the trench, wherein the forming of the via opening comprises:
performing a dry etch process to form a pilot opening through the second dielectric layer and a portion of the second ESL, and
after the performing of the dry etch process, performing a selective wet etch process to extend the pilot opening into the contact feature.

19. The method of claim 18, wherein the selective wet etch process comprises use of deionized (DI) water, 2-anilino-4-methyl-1,3-thiazole-5-carboxylic acid, nitric acid, hydrogen peroxide, hydrochloride, or isopropyl alcohol (IPA).

20. The method of claim 18, wherein the polymeric material comprises polyimide.

* * * * *